William H. King, Jr. Inventor

Sept. 29, 1970 W. H. KING, JR 3,531,663

INTEGRAL HEATER PIEZOELECTRIC DEVICES

Original Filed July 29, 1965 4 Sheets-Sheet 2

William H. King, Jr. Inventor

Sept. 29, 1970 W. H. KING, JR 3,531,663

INTEGRAL HEATER PIEZOELECTRIC DEVICES

Original Filed July 29, 1965 4 Sheets-Sheet 3

William H. King, Jr. Inventor

FREQUENCY VS. WATTS

William H. King, Jr. Inventor

United States Patent Office 3,531,663
Patented Sept. 29, 1970

3,531,663

INTEGRAL HEATER PIEZOELECTRIC DEVICES

William H. King, Jr., Florham Park, N.J., assignor to Esso Research and Engineering Company, a corporation of Delaware Original application July 29, 1965, Ser. No. 475,649, now Patent No. 3,478,573, dated Nov. 18, 1969. Divided and this application Nov. 26, 1968, Ser. No. 778,930
Int. Cl. H01v 7/00
U.S. Cl. 310—8.9 5 Claims

ABSTRACT OF THE DISCLOSURE

Piezoelectric crystals having integral heaters thereon are suitable for use in various measuring devices such as gas analyzers, thermal conductivity detectors, wattmeters, voltmeters, ammeters, etc.

CROSS-REFERENCE TO RELATED APPLICATIONS

Figure 1:
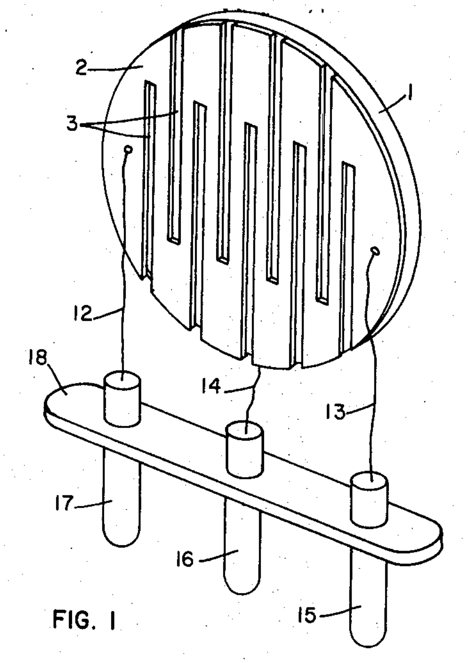

This is a division of application Ser. No. 475,649, filed July 29, 1965, now Pat. No. 3,478,573.

BACKGROUND OF THE INVENTION

Field of the invention

This invention relates to piezoelectric phenomena and, in general, concerns piezoelectric sensing elements suitable for use in a variety of applications. More particularly, this invention is directed to piezoelectric materials having thereon an integral heater and to their use in various devices such as those for measuring electrical voltage and current.

Description of the prior art

The utilization of piezoelectric phenomena for the selective analysis of fluid mixtures is known in the art and is particularly described in U.S. Pat. No. 3,164,004. The United States patent discloses a device or analyzer, and method of using same, for use in determining water in fuel; water and/or $H_2$ in powerformer feed; carbon dioxide in exhaust, flue gas and carbon analysis; and sulfur dioxide and sulfur trioxide in sulfur analysis. The analyzer described in the aforesaid United States patent, while entirely suitable for the uses enumerated, has certain inherent limitations which restrict its utility.

According to the present invention, an integral heater is incorporated on the surface of a piezoelectric material. This heater makes temperature control of the piezoelectric material simple and permits the use of such material at temperatures above ambient conditions, thereby affording new and practical uses of such materials in a variety of applications.

For example, integral heater piezoelectric devices of the instant invention can be used as thermal conductivity detectors, vacuum gauges, combustion detectors, wattmeters, voltmeters, ammeters, sorption-desorption detectors and as analyzers of gaseous streams, e.g., a water analyzer.

In one aspect of the present invention, it has been found that piezoelectric materials having an integral heater thereon and a coating, such as described in U.S. Pat. No. 3,164,004, sensitive to various environmental changes will exhibit different vibrational frequencies and amplitudes in response to the environmental changes to which the coating is sensitive or responsive.

Devices of the instant invention also exhibit increased utility over the prior art in that they can be used as remote indicators, since the devices of this invention can emit radio frequency (R.F.) signals which can be picked up by a simple radio receiver.

SUMMARY OF THE INVENTION

The piezoelectric materials to be used in accordance with this invention include materials which when subjected to mechanical pressure develop an electrical current and when subjected to an electrical current are mechanically deformed. Many such materials are well known in the art and include crystals such as quartz, tourmaline, Rochelle salts, barium titanate ceramic compositions, lead metaniobates, lead zirconate-lead titanates, and the like. Quartz is the particular crystal most often employed, but the recent development of barium titanite ceramics is making them extremely attractive for use as piezoelectric materials. The piezoelectrics materials to be used in this invention can be of any convenient geometric shape. Generally, the materials are substantially oval or round, but other cross-sectional shapes such as hexagons, squares and octagons can be used.

The particular frequency at which the piezoelectric material oscillates is dependent upon several factors, for example, the thickness of the material and, in the case of crystals, the particular axis along which it was cut.

The integral heater employed in this invention is an electrical resistance type heater which utilizes a heating element comprising a material which will conduct an electrical current and generate heat due to the resistance to the flow of electricity. Electrically conductive materials such as metals, e.g., gold, silver, copper, platinum, nickel, and aluminum, comprise the heating element.

The heating element can be applied to the surface of the piezoelectric material, for example, by vacuum evaporation or by precipitation from solution. The surface of the piezoelectric material can be either continuously or discontinuously covered with the heating element, as depicted in the appended drawings. A discontinuous covering is effected, for example, by the deposition of the desired electrically conductive material and another material which can be later leached from the surface, or by vacuum deposition through a masking device.

Generally, the integral heater is applied to just one side of the piezoelectric material. However, piezoelectric materials having integral heaters on more than one surface have some special utility.

In addition to the integral heater, piezoelectric materials of the present invention will, generally, have a suitable metal electrode thereon. In one embodiment of the invention, the piezoelectric material will be equipped with two suitable electrodes, e.g., radio frequency (R.F.) electrodes, and one of said R.F. electrodes will also function as the heating element of the integral heater. It is within the scope of the present invention, however, to include embodiments wherein the R.F. electrodes are not in electrical contact with the piezoelectric material. In such an embodiment, the heating element of the integral heater would not function as an R.F. electrode. The electrode(s) structure as well as the characteristics of the associated circuit will also effect the particular frequency at which the piezoelectric material oscillates.

Figure 2:
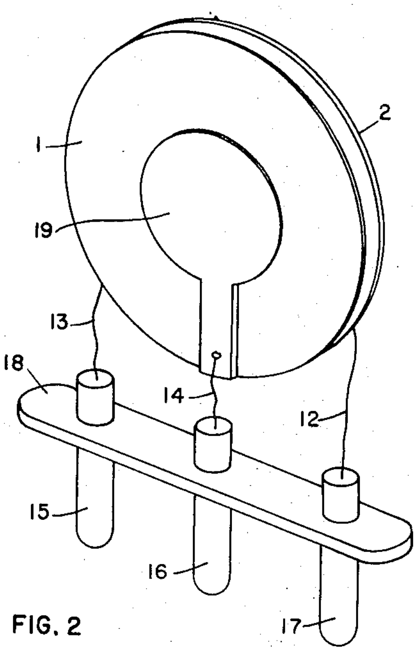
Figure 3:
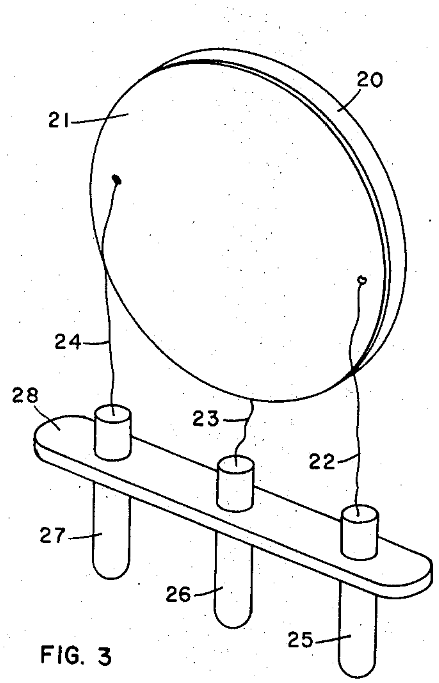
Figure 4:
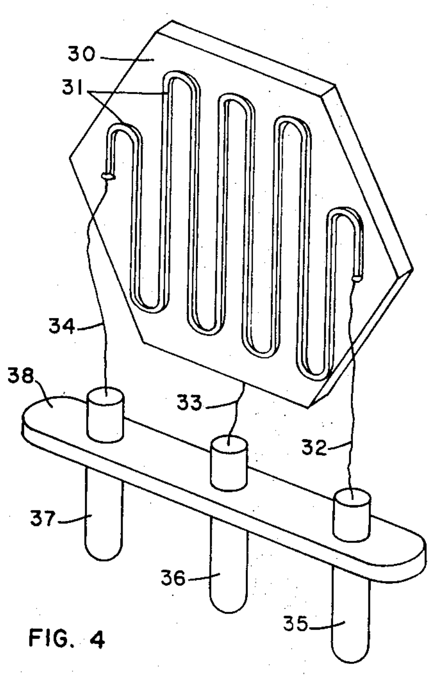
Figure 5:
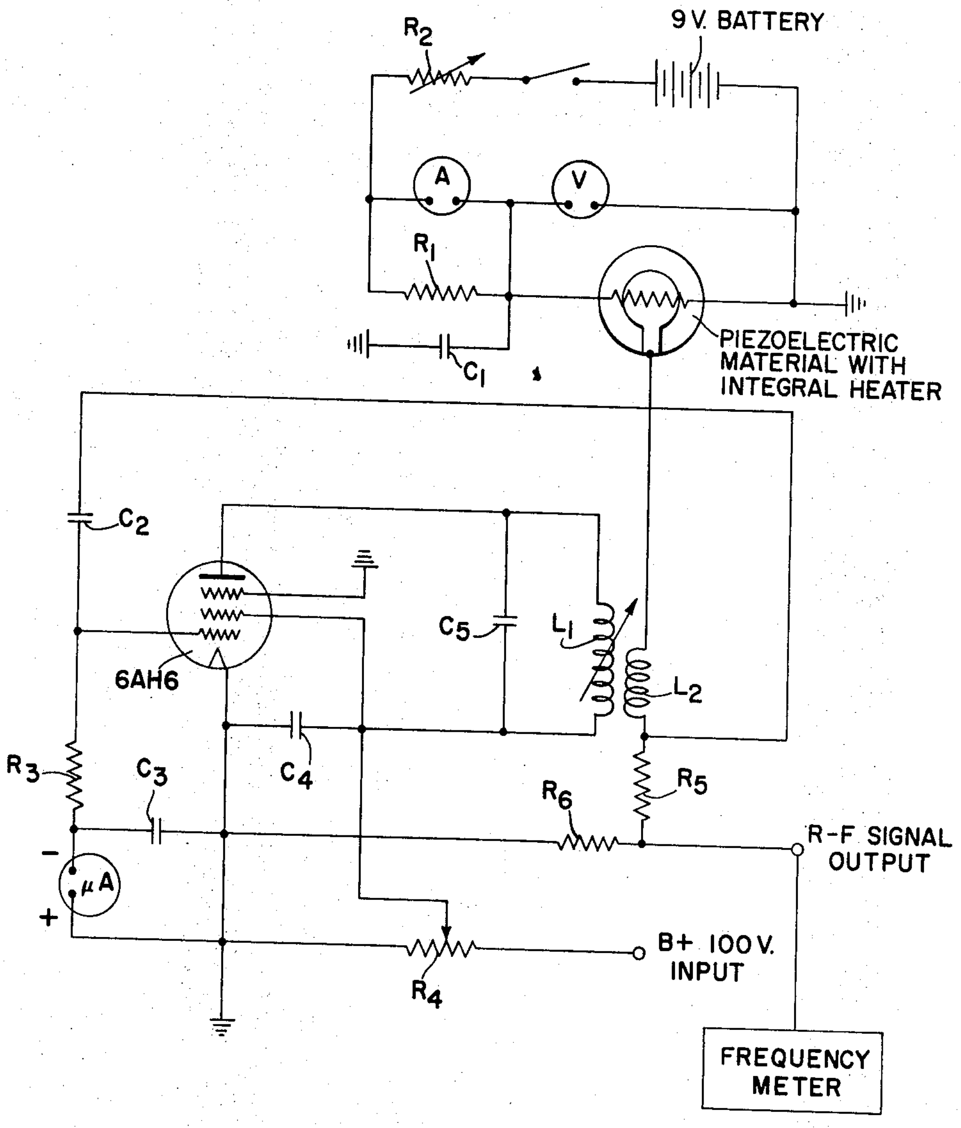
Figure 6:
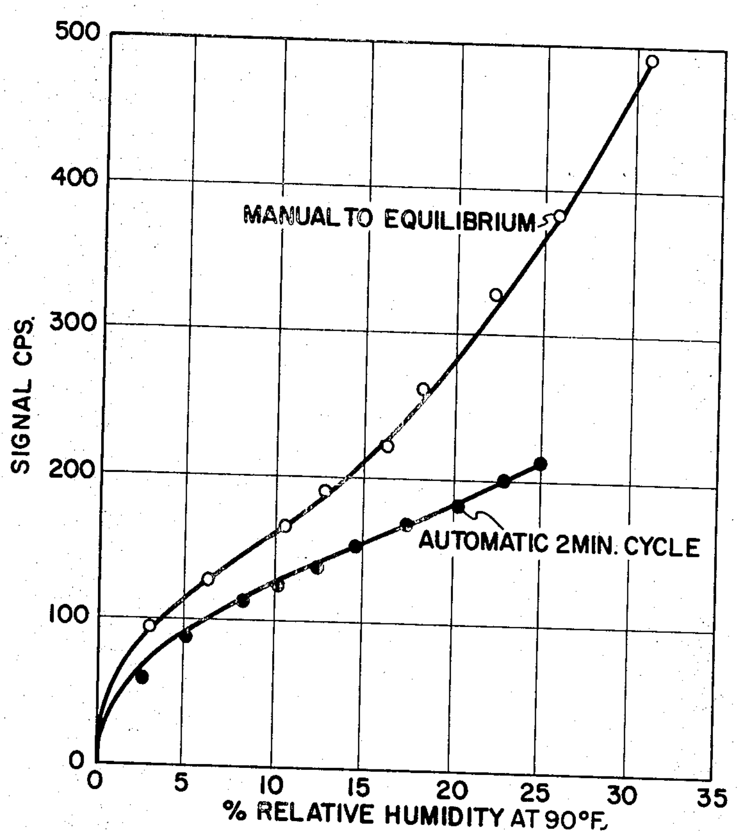
Figure 7:
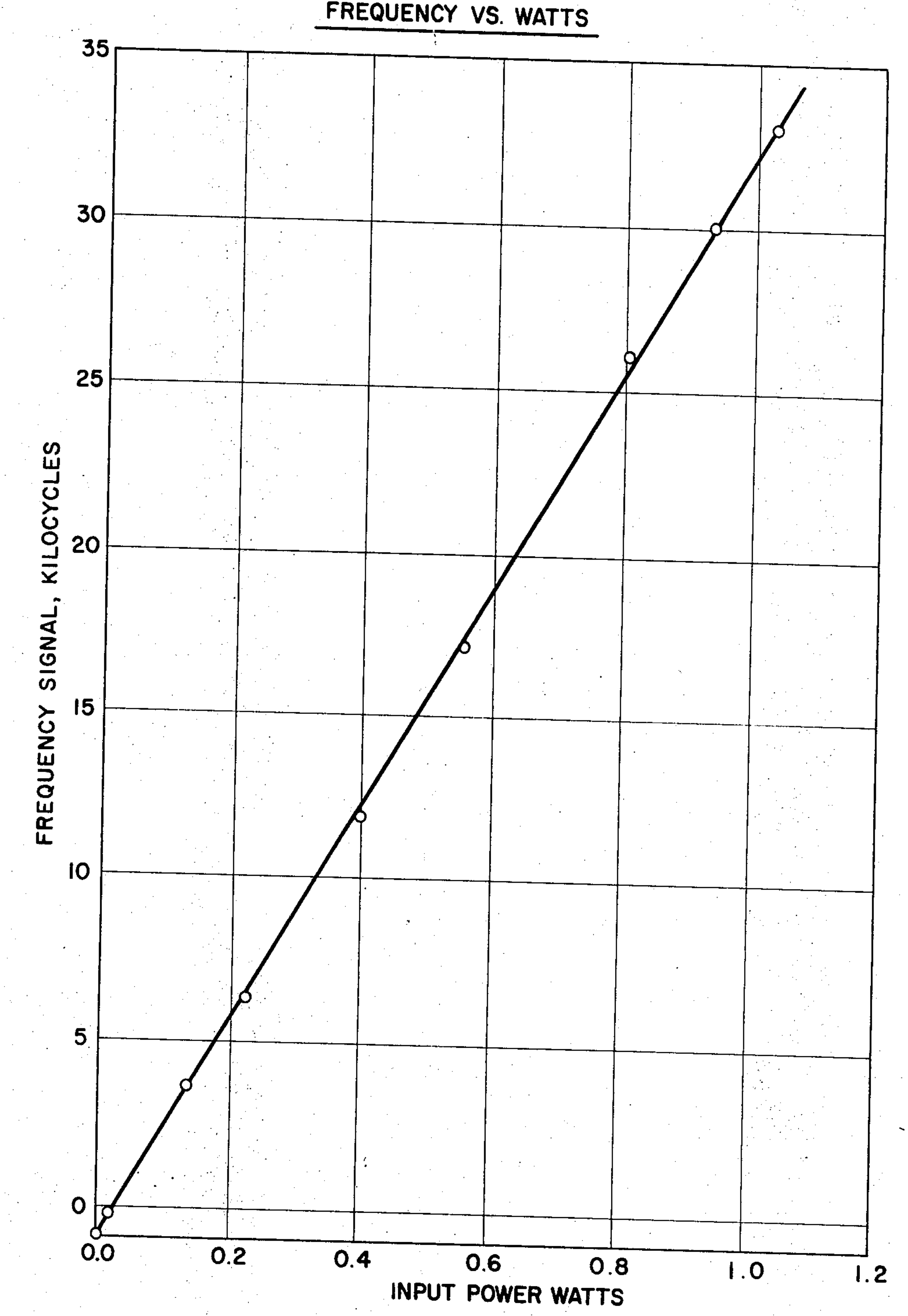

A better understanding of the instant invention can be achieved with reference to the attached figures. FIG. 1 is an isometric view of a piezoelectric quartz crystal having an integral heater thereon. FIG. 2 is an isometric view of the reverse side of the crystal depicted by FIG. 1. FIG. 3 is an isometric view of a piezoelectric material having a continuous covering or coating which functions as the integral heater. FIG. 4 is an isometric view of a piezoelectric material having a hexagonal cross-sectional geometric design. FIG. 5 is a typical electronic circuit which can be used in accordance with the present invention. FIG. 6 is a graphic representation of the frequency versus the input power of a device of the present invention. FIG. 7 is a graphic representation of frequency versus the percent relative humidity of a gas stream, in which a device of the present invention is employed as a water analyzer.

Referring now to FIG. 1, there is shown a piezoelectric quartz crystal 1 having an electrically conductive material or heating element 2 applied to a portion of one surface (conveniently referred to as the front surface) of the crystal 1 so that areas 3 of said front surface are not coated by the electrically conductive material 2. Electrical leads 12 and 13 are connected to the electrically conductive material 2 of the crystal 1 and to electrical connectors or plugs 17 and 15 respectively which plugs are adapted to be plugged into an electrical circuit (not shown) in order to effect a continuous circuit through the electrically conductive material 2. Lead 14 is in electrical connection between the R.F. electrode on the back side of crystal 1 and plug 16. Brace or support 18 is a rigid insulating material which holds plugs 15, 16 and 17 in position. The combination of heating element 2, leads 12 and 13, and plugs 15 and 17, are referred to as the "integral heater."

Referring now to FIG. 2, there is shown the reverse, i.e., back side of the crystal 1 of FIG. 1 comprising the back surface of crystal 1 having a coating of electrically conductive material 19 thereon. Coating 19 is connected to an electrical circuit (not shown) by means of lead 14 and plug 16. The combination of electrically conductive material 19, lead 14, and plug 16 is referred to as the "electrode." Elements 12, 13, 15, 17 and 18 are as described above with reference to FIG. 1. It is apparent that in the embodiment described in FIGS. 1 and 2, the integral heater also functions as an R.F. electrode.

Referring now to FIG. 3, there is s shown a piezoelectric material 20 having a substantially continuous coating of an electrically conductive material 21 thereon. Coating 21 is connected into an electrical circuit (not shown) by means of leads 22 and 24 and electrical connectors 25 and 27. Again, as in FIG. 2, the coating on the reverse side of piezoelectric material 20 is connected into an electrical circuit by means of a lead 23 and a plug 26. Plugs 25, 26 and 27 are retained in a fixed position by rigid brace or support 28. Again, as in FIGS. 1 and 2 the integral heater also functions as an electrode.

Referring now to FIG. 4, there is shown a hexagonal-shaped piezoelectric material 30 having an electrically conductive material 31 thereon, which material 31 is connected to an electrical circuit (not shown) by means of leads 32 and 34 and plugs 35 and 37. The electrically conductive material (not shown) on the reverse side of the piezoelectric material 30 is connected into an electrical circuit by means of lead 33 and plug 36. Plugs 35, 36 and 37 are maintained in a rigid position by means of a brace member or support 38.

Referring now to FIG. 5, there is shown an electronic circuit which can be conveniently used to simultaneously heat the integral heating element of the piezoelectric material and observe vibration changes. In the examples that follow this circuit was employed, although any conventional crystal oscillator circuit would be suitable for use in the present invention, provided adequate means were employed to isolate the R.F. circuit from the heating circuit. The circuit shown in FIG. 5 operates with one R.F. electrode at ground potential. Thus, the heating circuit can be operated at ground potential, which is very convenient experimentally.

The heating circuit part of FIG. 5 is shown in the upper part of the drawing. A battery or other suitable source of power causes a current to flow through the integral heater and the associated parts. The voltage across integral heater on the piezoelectric material (e.g., quartz crystal) and its current are indicated by voltmeter V and ampmeter A. $R_1$ is a shunt to adjust the range of meter A. $R_2$ is a variable resistance used to regulate the current. $C_1$ is a R.F. shunt to keep the heating circuit at R.F. ground. Appropriate changes in the heating circuit are made in the following examples and these changes will be apparent to those skilled in the art from the example described.

The lower portion of FIG. 5 is the plate tuned oscillator used to energize the piezoelectric material R.F. electrodes. If said R.F. electrodes were shorted to ground, then the circuit would be a conventional tuned plate oscillator free running at a frequency determined mainly by the values of the tank circuit $C_5$ and $L_1$. Detailed descriptions of the tuned plate oscillator are contained in most radio handbooks and electronics textbooks and, therefore, will be omitted here. By placing the piezoelectric material in the ground return lead of the grid feedback circuit the oscillator will lock on to the piezoelectric material frequency as next described.

The grid feedback circuit path contains the piezoelectric material, the low impedance pickup loop $L_2$, and $R_5$ plus $R_6$ in series. The feedback voltage to the grid will be maximum when the current through $R_5$ and $R_6$ is maximum. This occurs when the piezoelectric material impedance is lowest. This condition is met near series resonance of the piezoelectric material. Series resonance can be recognized and attained several ways when adjusting the valve of $L_1$. For example, an R.F. probe placed on the piezoelectric material will show minimum R.F. voltage, the grid current will show a maximum, and the R.F. output signal will also show a maximum. FIG. 5 depicts only the grid current measurement method. At series resonance the piezoelectric material impedance will be mainly that of a low resistance having a value of several ohms. By replacing the piezoelectric material with a resistor of equal value, the circuit will perform unaffected. This substitution was made to obtain the data on motional resistance as elaborated in Example II which follows. The drive level of the piezoelectric material is adjusted to a safe level by means of potentiometer $R_4$ which controls the amount of D.C. voltage feed to the tube. The function of other circuit elements is apparent from FIG. 5.

The following examples are submitted in order to more particularly describe the present invention and are not to be construed as a limitation upon the scope of the invention as set forth in the appended claims.

DESCRIPTION OF THE PREFERRED EMBODIMENTS

Example I

A quartz crystal having an integral heater thereon as set forth in FIG. 1 was made by first cleaning a quartz crystal thoroughly in acid and then in an ultrasonic bath containing water and ammonia. The crystal was then rinsed in a flowing stream of water then in methyl alcohol and then allowed to dry. The crystal was then positioned in a shadow mask and then placed in a vacuum evaporator. The pressure in the evaporator was then reduced to about 0.1 micron at which time gold was evaporated from the tungsten filament through the mask onto the crystal. The crystal was then placed in another shadow mask in order to form the metal coating of electrically conductive material on the reverse side, such as shown in FIG. 2. After depositing the gold on both sides or, if desired, one side at a time, the electrodes were nickel-plated by immersing the metal-clad crystal in a nickel electroplating solution. Fine wires were then soldered directly to the metal coatings on each side of the crystal to form electrical leads. The shadow masks can be made, for example, by making appropriate sized holes in the metal shield and then soldering wires across the hole to give the desired pattern. The wires can be kept parallel and centered by stretching.

Example II

Two quartz crystals, crystals "A" and "B," were tested for their response to temperature changes. AC cut 9 mc. crystals were chosen because they are standard in the industry for the measurement of the temperature of crystal ovens and are reported to have a frequency-temperature coefficient of 20 p.p.m./° C. Table I lists data obtained on the temperature calibration run.

TABLE I.—CALIBRATION OF STANDARD AC CUT CRYSTALS

| | Crystal A, kcs. | Crystal B, kcs. |
|---|---|---|
| Cell temp., ° F. | | |
| −40 | 8,993.940 | 8,993.530 |
| −28 | 8,995.000 | 8,995.594 |
| +7 | 8,998.540 | 8,998.135 |
| +54 | 9,002.883 | 9,002.496 |
| +74 | 9,004.869 | 9,004.511 |
| 89.5 | 9,006.619 | 9,006.145 |
| 94 | 9,006.923 | 9,006.528 |
| 128 | 9,010.555 | 9,010.135 |
| 152 | 9,013.343 | 9,012.914 |
| 175 | 9,016.150 | 9,015.703 |
| 200 | 9,019.264 | 9,018.798 |
| 251.5 | 9,026.230 | 9,025.712 |
| 252 | 9,026.400 | 9,025.880 |
| 280 | 9,030.183 | 9,029.630 |
| 306 | 9,034.600 | 9,034.023 |
| 332 | 9,039.050 | 9,038.450 |

The slight frequency mismatch of about 400 c.p.s. can easily be adjusted to any arbitrary value including zero by inserting a capacitor into the circuit of one crystal. Crystals A and B track each other within about 100 c.p.s., which corresponds roughly to 1° F. The data shown in Table II were determined on a device of the present invention comprising an AC cut crystal with an integral heater attached substantially as described in Example 1.

TABLE II.—CALIBRATION OF INTEGRAL HEATER AC CUT CRYSTAL

| | Frequency, kcs. | Heater resistance, ohms | Motional resistance, ohms [1] |
|---|---|---|---|
| Cell temp., ° F.: | | | |
| +57 | 8,992.880 | 12.45 | 13.0 |
| +76 | 8,924.650 | 12.72 | 13.2 |
| 101 | 8,926.843 | 13.15 | 14.6 |
| 132 | 8,930.190 | 13.80 | 19.7 |
| 158 | 8,933.100 | 14.43 | 24.0 |
| 200 | 8,938.060 | 15.27 | 27.4 |
| 239 | 8,943.470 | 16.15 | 20.8 |
| 260 | 8,946.590 | 16.72 | 16.6 |
| 296 | 8,951.850 | 17.55 | 12.4 |
| 332 | 8,957.350 | 18.38 | 14.5 |

[1] Determine in series resonant circuit at minimum voltage of 0.1 v. rms. on the crystal R.F. electrode, see FIG. 5.

The pertinent data from Tables I and II are summarized in Table III where the temperature coefficients of the standard AC cut crystal and the integral heater AC cut crystal are shown.

TABLE III.—TEMPERATURE COEFFICIENTS OF STANDARD AND INTEGRAL HEATER CRYSTALS

| | Standard, p.p.m./° F. | Heater, p.p.m./° F. |
|---|---|---|
| Temperature interval, ° F.: | | |
| −40 to +50 | 10.6 | --------- |
| +50 to +100 | 11.1 | 10.4 |
| 100 to 150 | 12.3 | 12.1 |
| 150 to 200 | 13.6 | 13.9 |
| 200 to 250 | 15.5 | 15.5 |
| 250 to 300 | 16.4 | 16.6 |
| 300 to 350 | 19.1 | 17.5 |

These data show that the addition of the integral heater to the crystal does not materially affect its temperature-frequency characteristics. At the same time the temperature coefficients were being determined on the integral heater crystal, the resistance of the heater element was determined along with the motional impedance of the crystal. The slight variation of the motional resistance of the crystal indicates that the ability to vibrate is not seriously affected by the temperature of operation.

Example III

An AC cut crystal with integral heater was tested for its electrical characteristics. The crystal was tested in a brass cell at 92° F. with 50 cc./minute of dry air purge. The frequency as a function of electrical power delivered to the integral heater was recorded. These data are listed in Table IV.

TEST IV.—WATTMETER TEST, INTEGRAL HEATER ON AC CUT CRYSTAL

| Heater condition | | | Frequency, kcs. |
|---|---|---|---|
| Volts | Amps | Watts | |
| 0.1308 | 0.0100 | 0.0013 | 8,924.973 |
| 0.6645 | 0.0505 | 0.032 | 8,925.994 |
| 1.389 | 0.1000 | 0.139 | 8,929.465 |
| 2.097 | 0.1418 | 0.297 | 8,934.833 |
| 2.725 | 0.1735 | 0.472 | 8,941.181 |
| 3.155 | 0.1819 | 0.604 | 8,946.103 |
| 3.607 | 0.2092 | 0.842 | 8,955.039 |
| 0.1309 | 0.0100 | 0.0013 | 8,925.000 |
| 4.395 | 0.2345 | 1.03 | 8,962.695 |
| Cool 5 min. at 92° F. | | 0.0013 | 8,925.031 |

NOTE.—50 cc./min. dry air flow, crystal was centered in a ⅜"x¾"x1" milled hole in a brass cell thermostated to 92° F., circuit was series resonant.

The high degree of linearity of the frequency signal versus the input power supplied to the integral heater is shown by FIG. 7. The wattmeter is sensitive, as the data show 34 cycles/second change per milliwatt of power. Literature sources show that nickel changes its resistance with temperature approximately 0.47%/° C. The temperature coefficient observed on the crystal was 0.24%/° C. The lower observed value is due to the presence of the underlying gold film which probably alloyed with the nickel. Linear frequency versus current or voltage characteristics could also be obtained by changing the heater element composition to other alloys whose resistance have the appropriate temperature coefficient.

Example IV

A thermal-conductivity detector was made with both an analog output and a frequency output by employing integral heater AC cut crystals. The two heaters formed two arms of a Wheatstone bridge and a 25-ohm helipot served as an adjustable ratio control for the other two arms of the bridge. With the same gas flowing over both the reference crystal and detector crystal and with power applied to the bridge, the helipot was adjusted so the voltage difference appearing between the two heating elements was equal. In this way both crystals received the same power. Blends of helium in air were then flowed in a steady state over the detector crystal maintaining pure helium over the reference. The resultant frequency signals and bridge unbalance signals were recorded and are listed in Table V.

TABLE V.—THERMAL CONDUCTIVITY DETECTOR USING INTEGRAL HEATER AC CUT CRYSTAL

| Mol. percent air in helium | Frequency change, cps. | Heater condition | | Bridge output, mv. |
|---|---|---|---|---|
| | | Volts | Amps | |
| 0.0 | 0 | 4.24 | 0.273 | 0 |
| 1.1 | 400 | 4.29 | 0.274 | 5.5 |
| 0.0 | 0 | 4.31 | 0.275 | 0 |
| 2.8 | 960 | 4.33 | 0.275 | 15.0 |
| 6.3 | 1,710 | 4.27 | 0.270 | 30.0 |

NOTE.—50 cc./min. flow rate in brass cell thermostated to 101° F., matched heater crystals were connected in a bridge circuit using a 25 ohm helipot as the other two arms, the ΔE above is the bridge unbalance signal. Response time was 0.75 minute for 63% and 1.9 minute for 95% of full scale.

The ability to obtain the detector output signal in the form of a frequency is of great advantage in that the results can be read out digitally and at a remote point via radio pickup of the radio frequency signals.

Example V

The Pirani gauge type of measurement can also be accomplished with the AC cut crystals having integral heaters. A Pirani vacuum gauge is essentially a thermal-conductivity cell where one variable resistance element (compensator) is contained in a sealed-off vacuum while the other sensing resistor is exposed to the vacuum in question. A vacuum gauge experiment was conducted by measuring the frequency of the integral heater AC cut crystal as a function of the absolute pressure in the cell chamber. The detector cell housing was thermostated at 91° F. so a reference crystal was not necessary in this experiment. The current through the heater element of the crystal was maintained constant at 0.175 amp. The data from this test are listed in Table VI.

TABLE VI.—VACUUM GAUGE EXPERIMENT, HEATER ON AC CUT

| | Heater condition | | Frequency, kcs. |
|---|---|---|---|
| | Volts | Amps.[1] | |
| Abs. pressure mm. Hg (torr): | | | |
| 0.04 | 3.172 | 0.175 | [2] 8,957.325 |
| 0.06 | 3.125 | 0.175 | [2] 8,955.142 |
| 0.12 | 3.015 | 0.175 | [2] 8,950.574 |
| 0.30 | 2.910 | 0.175 | 8,947.100 |
| 0.60 | | | 8,946.100 |
| 1.20 | 2.850 | 0.175 | 8,945.060 |
| 10.00 | 2.825 | 0.175 | 8,944.136 |
| 85.00 | 2.820 | 0.175 | 8,944.150 |
| 215.00 | 2.820 | 0.175 | 8,944.100 |
| 445.00 | 2.820 | 0.175 | 8,943.810 |
| 590.00 | 2.820 | 0.175 | 8,943.300 |
| 760.00 | 2.820 | 0.175 | 8,942.500 |

[1] Controlled at constant current as shown, detector cell at 91° C.
[2] 81 kc./torr.

A high sensitivity was obtained at low pressures amounting to 81 kc./torr. Like all Pirani gauges the device has a useful range between 0 and 0.3 mm. of Hg. (1 torr). At presssures from 0.3 torr up to atmospheric pressure, the thermal-conductivity of the gas does not change a great deal. The vacuum gauge described here with a frequency readout would have many advantages in leak hunting vacuum equipment because the signal could be made audible and remotely picked up.

Example VI

In some applications, it is important to have a detector system whose frequency will not change when the temperature is changed so that any resulting frequency shift would be entirely due to the sorption-desorption of the solute gas. The AT cut crystal suits this purpose. Table VII shows the frequency response of an AT cut 10 mc. crystal with integral heater as a function of temperature.

TABLE VII.—INTEGRAL HEATER ON AT CUT CRYSTAL CALIBRATION

| | Frequency, kcs. | Heater resistance, ohms |
|---|---|---|
| Crystal temp.; ° F.: | | |
| 72 | 9,849.200 | 37.70 |
| 76 | 9,849.294 | 37.85 |
| 136 | 9,849.175 | 44.50 |
| 238 | 9,849.139 | 47.20 |
| 293 | 9,849.604 | 50.85 |
| 348 | 9,850.823 | 54.50 |

NOTE.—Crystal was ½"x½"x0.0066" AT cut quartz plate with nickel heater one side, ⅝" electrode on other side, in standard brass cell holder, 50 cc./minute dry air flow. Series resonant frequency 9,848.650, motional resistance 27~(LAVOI) at 75° F. Matching crystal $F_r$=9,851.000, $R_r$=12S, heater 39.8 at 75° F.

It is observed that a very wide temperature range (72 to 240°) does not materially affect the detector's frequency. A sorption-desorption experiment was performed using two matched AT cut crystals with integral heaters. The same current was passed through both detectors in order to dissipate approximately 0.67 watt in each crystal. The resulting temperature was about 250° F. One of the crystals was coated with approximately 6 kc. of sulfonated polystyrene to make it sensitive to water. The concentration of water in the inlet gas was changed, and at each concentration level frequency readings were obtained with the power on and with the power off. The difference reading was taken as a signal for water content. FIG. 6 is a graph showing the signal obtained for both equilibrium conditions where the power level was maintained until equilibrium was established. Data are also shown for automatic switching where the power was interrupted by a timer (power on 1 minute and power off 1 minute). The data show the utility of such a system.

What is claimed is:

1. An electrical signal measuring instrument capable of being used as either of a wattmeter, voltmeter or ammeter which comprises:
   (a) a piezoelectric element consisting essentially of a piezoelectric material having an integral electrical heater thereon and being characterized as having an oscillation frequency dependent upon temperature;
   (b) means for impressing an electrical current through said heater so that the temperature of said heater and piezoelectric material varies in relation to the intensity of the current;
   (c) electronic oscillator means for vibrating the piezoelectric material; and
   (d) means for measuring changes in the frequency of said piezoelectric material in response to changes in said current.

2. The device of claim 1 wherein component (a) comprises a piezoelectric quartz crystal and an integral heating element on at least one surface of said crystal.

3. The device of claim 2 wherein said quartz crystal is an AT cut crystal.

4. The device of claim 3 wherein said heating element is gold.

5. The device of claim 4 wherein two opposed surfaces of said crystal each have said integral heating elements thereon.

References Cited

UNITED STATES PATENTS 3,329,004 7/1967 King ---------------- 73—23
2,975,261 3/1961 Keen et al. ------ 310—8.9 XR

FOREIGN PATENTS 824,786 12/1959 Great Britain.

DONOVAN F. DUGGAN, Primary Examiner

B. A. REYNOLDS, Assistant Examiner

U.S. Cl. X.R.

310—9.4